(12) United States Patent
Chun Liu et al.

(10) Patent No.: US 7,079,307 B2
(45) Date of Patent: Jul. 18, 2006

(54) WAVELENGTH CONVERSION DEVICE WITH AVALANCHE MULTIPLIER

(75) Inventors: Hui Chun Liu, Orleans (CA); Dayan Ban, Ottawa (CA); Hui Luo, Markham (CA)

(73) Assignee: National Research Council of Canada, Ottawa (CA)

( * ) Notice: Subject to any disclaimer, the term of this patent is extended or adjusted under 35 U.S.C. 154(b) by 258 days.

(21) Appl. No.: 10/685,538

(22) Filed: Oct. 16, 2003

(65) Prior Publication Data

US 2005/0083567 A1 Apr. 21, 2005

(51) Int. Cl.
*G02F 2/02* (2006.01)
*H01S 5/50* (2006.01)

(52) U.S. Cl. ...................... 359/326; 359/344

(58) Field of Classification Search ........ 359/326–332, 359/344
See application file for complete search history.

(56) References Cited

U.S. PATENT DOCUMENTS

| 4,873,555 | A | | 10/1989 | Coon et al. |
| 4,894,526 | A | | 1/1990 | Bethea et al. |
| 5,567,955 | A | | 10/1996 | Liu |
| 5,892,222 | A | * | 4/1999 | Elabd .................. 250/226 |
| 6,028,323 | A | * | 2/2000 | Liu .................... 257/21 |
| 6,563,627 | B1 | * | 5/2003 | Yoo ................... 359/326 |
| 6,768,827 | B1 | * | 7/2004 | Yoo ................... 385/14 |
| 6,819,476 | B1 | * | 11/2004 | Hunt ................... 359/326 |

* cited by examiner

*Primary Examiner*—John D. Lee
(74) *Attorney, Agent, or Firm*—Marks & Clerk; Richard J. Mitchell

(57) ABSTRACT

A wavelength conversion device includes a photodetector for generating a photocurrent in response to the detection of radiation at a first wavelength. An avalanche multiplier amplifies the signal photocurrent and feeds this to a light emitting element that produces radiation at a second wavelength shorter than the first wavelength and corresponding to the detected radiation at the first wavelength. The components are assembled together in an integrated stacked arrangement either by epitaxial growth or wafer fusion of the individual components. The device is useful as an image intensifier or thermal imaging device.

20 Claims, 6 Drawing Sheets

CCD camera image of a working device

Up-conversion emission spectra

WAVELENGTH CONVERSION DEVICE WITH AVALANCHE MULTIPLIER

FIELD OF THE INVENTION

This invention relates to the field of photonics, and in particular to a wavelength conversion device for converting radiation from one wavelength to another, and a method of making such a device.

BACKGROUND OF THE INVENTION

Infrared imaging is widely used in a variety of applications including night vision, surveillance, search and rescue, remote sensing, and preventive maintenance. Imaging devices for these applications, which must be able to detect near, mid and far infrared light, are typically constructed from InGaAs, InSb and HgCdTe focal plane arrays. Such arrays are complicated to manufacture and costly.

Alternatively, quantum well infrared photodetectors (QWIPs) can detect mid and far infrared light. QWIP devices are described in U.S. Pat. No. 4,873,555, issued Oct. 10, 1989 to the University of Pittsburgh and in U.S. Pat. No. 4,894,526 issued Jan. 16, 1990 to American Telephone and Telegraph Company, AT&T Bell Laboratories. The latter patent describes a QWIP device which utilizes a series of quantum wells and thus has a better efficiency.

Infrared thermal imaging, which incorporates GaAs QWIPs and GaAs LEDs (Light Emitting Diodes) via epitaxial growth integration, was disclosed by H. C. Liu, in U.S. Pat. No. 5,567,955 issued Oct. 22, 1996 and in U.S. Pat. No. 6,028,323 issued Feb. 22, 2000, both to the National Research Council of Canada and which are incorporated herein by reference. The former patent describes the vertical integration of a light emitting diode with a QWIP.

Current from the QWIP device resulting from the impingement of far-infrared (FIR) light on the photodetector drives the LED to emit near infrared (NIR) energy. This energy can be efficiently detected by a low-cost silicon CCD (Charge Coupled Device), leading to a highly efficient detector. The device described in U.S. Pat. No. 5,567,955 requires a substantially transparent substrate. This requirement is no longer necessary for the devices described in U.S. Pat. No. 6,028,323, in which the input FIR energy is launched into a same side (face) of the device from which the up-converted NIR energy is collected.

U.S. Pat. No. 6,028,323 described devices that can be used as a pixelless means of up-converting and imaging a FIR beam to a NIR beam, presented device and system configurations that allows the input FIR energy and output NIR energy through the same side of the device, and elucidated measures that minimizes the blurring and smearing effects.

In both aforementioned patents, the vertical device integration relies on subsequent epitaxial growth of the LED layers over the QWIP layers on a same substrate.

Recently, an InGaAs/InP based p-i-n photodetector (PD) operating at a peak wavelength of 1.5 μm has been integrated with a GaAs-based LED in the near infrared region, as reported by Ban et al. The operation principle is as following. The structure of the device is a back-to-back p-i-n PD and LED, with a common p-region in the middle. Under normal operation conditions, the PD is reverse biased and the LED is forward biased. Incident infrared light (with peak wavelength at 1.65 μm or shorter), shone onto the back of the device, is absorbed by the $In_{0.53}Ga_{0.47}As$ PD. The resulting photocurrent drives the LED to emit at 0.87 μm, which is collected from the device top surface. The $In_{0.53}Ga_{0.47}As$/InP PD was grown by metal organic chemical vapor deposition (MOCVD) on an n-type InP substrate. The GaAs/AlGaAs LED structure was grown by molecular beam epitaxy (MBE) on an n-type GaAs substrate. The two wafers were bonded together via wafer fusion.

Wafer fusion is an advanced processing technology that allows the integration of heterogeneous semiconductor materials regardless of their lattice constants. It removes the limitations associated with the use of lattice-matched materials and gives a new degree of freedom for the design of semiconductor optoelectronic devices. Wafer fusion is described, for example, in Yang et al. in Appl. Phys. Lett., Vol. 79, pp. 970–972, 2001; Karim et al. in Appl. Phys. Lett., Vol. 78, pp. 2632–2634, 2001; Tan et al. in J. Electron. Materials, Vol. 29, pp. 188–194, 2000; and Levine et al. in Appl. Phys. Lett., Vol. 75, pp. 2141–2143, 1999, the contents of which are herein incorporated by reference. Wafer fusion can be simply described as a direct bonding in which chemical bonds are established between two wafers/materials at their hetero-interface in the absence of an intermediate layer.

SUMMARY OF THE INVENTION

The invention provides a device wherein a photodetector (PD), an avalanche multiplier (Amplifier), and a light emitting diode (LED) are integrated vertically either via subsequent epitaxial growth of the different functioning layers on a same wafer or via wafer fusion of the functioning layers which are grown on different wafers.

Accordingly therefore a first aspect of the invention provides a wavelength conversion device comprising in an integrated stacked arrangement a photodetector for generating a photocurrent in response to the detection of radiation at a first wavelength; an avalanche multiplier for amplifying said photocurrent; and a light emitting element driven by said amplified photocurrent to produce radiation at a second wavelength different from said first wavelength and corresponding to detected radiation at said first wavelength.

The invention is mainly used for up conversion, that is where the second wavelength is shorter than the first wavelength. The conversion direction refers to the energy of the photons. Thus, up conversion relates to converting lower energy photons to higher energy photons, the higher energy photons of course having a shorter wavelength. The invention can however also be applied to down conversion.

The resulting integrated device will detect an incoming infrared (IR) signal, amplify the signal photocurrent, and then convert the amplified signal back to IR light with a shorter wavelength. With the amplification of the incorporated avalanche multiplier, the incoming infrared image will be significantly intensified and converted to the outgoing image. Current from the photodetector (PD) resulting from the impingement of IR radiation typically in the wavelength range of 1.1 to 1.65 μm is amplified by the avalanche multiplier, and drives the LED to emit photons with shorter wavelength, e.g., at 872 nm or visible light range. The output energy can be efficiently detected by a silicon CCD (charge coupled device). The integrated device can thus act as a solid-state image intensifier in addition to a wavelength up-converter.

Wavelength up-conversion from a range of 1.1–1.65 μm to below 1.0 μm (e.g., 872 nm or 923 nm) permits the highly-efficient detection by a silicon-based CCD camera. In a preferred embodiment, wafer fusion technology permits the exploitation of the best performance of each functioning unit in a single device by optimizing the epitaxial layers independently.

Methods for making pixelized and pixelless QWIP-LED imaging devices are described in the afore-mentioned U.S. Pat. No. 5,567,955 and U.S. Pat. No. 6,028,323, respectively. These methods can be used for making pixelized and pixelless imaging devices using the wavelength converter of the invention. The device micro-fabrication mainly involves mesa etching for device isolation and metal depositions for electrical contacts. Additional steps such as depositions of anti-reflection coatings and fabrication of micro-lens on device top surface may be taken for improving device performance.

The photodetector preferably comprises a III-V material system, such as $In_xGa_{1-x}As/InP$, where x is preferably 0.53. The basic physics and operations of $In_{0.53}Ga_{0.47}As/InP$ photodetectors are well known and have been described in many publications and books, for example, in "Infrared Detectors and Systems" by Dereniak and Boreman, the contents of which are herein incorporated by reference. The photodetectors respond in the range from 0.5 to 1.65 μm. An undoped $In_{0.53}Ga_{0.47}As$ active region is typically clad by n- and p-doped InP layers from the top and bottom. This p-i-n structure is operated under reverse bias so that the photocurrent resulting from the IR photon absorption is almost fully collected. The underlying physics of an avalanche multiplier can be found in Chapter 5 of "Semiconductors and Semimetals" volume 12, Infrared detectors II, edited by Willardson and Beer, the contents of which are herein incorporated by reference.

In an avalanche multiplier, the primary free carriers (herein the photogenerated carriers from the PD) gain sufficient energy from the electric field to generate additional (secondary) free carriers by impact ionization of the valence electrons into the conduction band, leaving free holes in the valence band. Secondary carriers that are generated in this way can in turn be accelerated by the electric field and generate more secondary carriers when they impact-ionize other valence electrons. As a consequence, the input signal can be amplified by many times.

GaAs-based LEDs and Si CCD are widely available commercial products, and the basic physics and operation of these devices are discussed in standard textbooks, for example, in Secs. 12.3 and 7.4 of "Physics of Semiconductor Devices" by Sze, the contents of which are herein incorporated by reference.

The integration can result from subsequent epitaxial deposition of, for example, $In_{0.53}Ga_{0.47}As/InP$ photodetector layers, an InP avalanche layer, and InP-based LED layers on a single InP substrate. Alternatively, the integration can also result from wafer fusion of different functioning epitaxial layers, which are grown on different substrate wafers. The preferable material systems are $In_{0.53}Ga_{0.47}As/InP$ for the PD, GaAs for the avalanche multiplier and GaAs/AlGaAs for the LED, respectively.

In accordance with a second aspect the invention therefore provides a method of making a wavelength conversion device, comprising growing in sequence as epitaxial layers: a photodetector for generating a photocurrent in response to the detection of radiation at a first wavelength; an avalanche multiplier for amplifying said photocurrent; and a light emitting diode driven by said amplified photocurrent to produce radiation at a second wavelength different from first wavelength and corresponding to detected radiation at said first wavelength.

In accordance with another embodiment, the integrated PD, amplifier and LED are divided into a two dimensional arrays, all being connected in parallel, to achieve pixelized imaging function. Alternatively, a single large-area device of the integrated PD, amplifier and LED with optical windows of approximately between 2 mm×2 mm to 20 mm×20 mm is provided for pixelless image up-conversion and amplification.

In accordance with yet another embodiment, further measures, including the fabrication of micro-lens on device emission surface and the deployment of a micro-cavity enhancement effect, can be taken to improve the device performance.

BRIEF DESCRIPTION OF THE DRAWINGS

The invention will now be described in more detail, by way of example only, with reference to the accompanying drawings, in which.

DETAILED DESCRIPTION OF THE INVENTION

Figure 1:
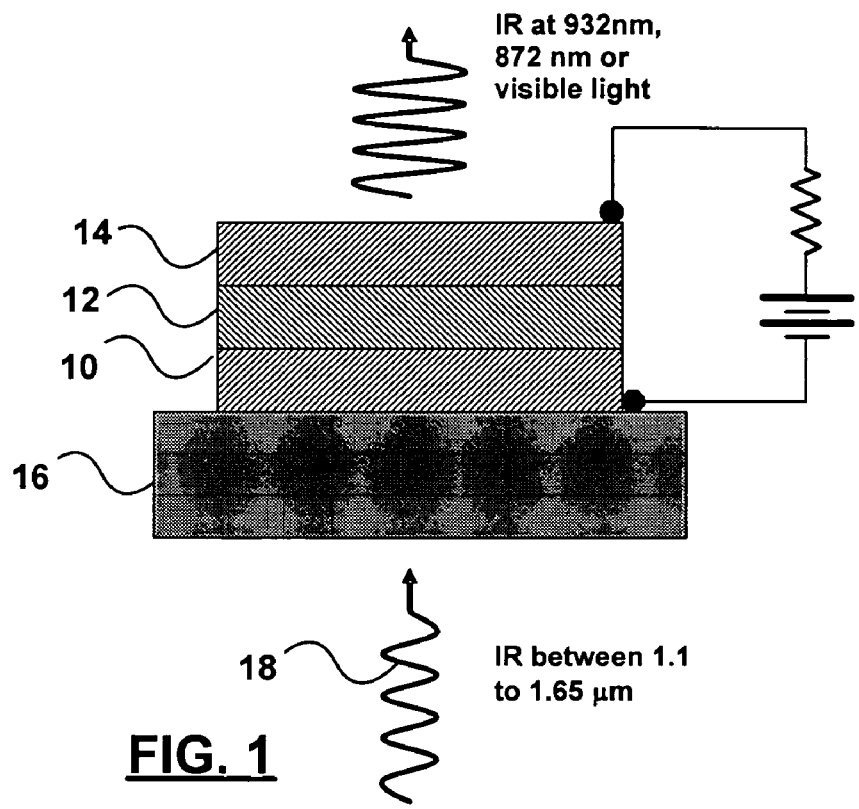
FIG. 1 is a representative cross-section (not to scale) of a solid-state wavelength up converting image intensifier device.

FIG. 1 illustrates in schematic form one embodiment of the invention in its most basic form.

A photodetector (PD) 10, an avalanche multiplier 12, and an LED 14 are integrated on a substrate 16 in a stacked arrangement. The substrate 16 is transparent to the incoming IR energy (in wavelength range of 1.1 to 1.65 µm) to pass through it to the photodetector 10.

Upon application of a bias current, e.g. from a battery via a load resistor, to the stacked PD 10, avalanche multiplier 12 and LED 14 in series, the same current passes through all of the components. The incoming IR energy 18 generates signal photocurrent in the PD component 10, which is substantially amplified by the avalanche multiplier 12 and passes into the LED 14.

The increase of bias current due to the generation and amplification of the signal photocurrent leads to the increase of LED emission at 0.87 µm (or 0.932 µm, or visible light wavelength, depending on the materials used for the LED active region), which can be detected by a detector or a CCD camera. The operation of wavelength up-conversion and image intensification is therefore achieved.

Figure 2:
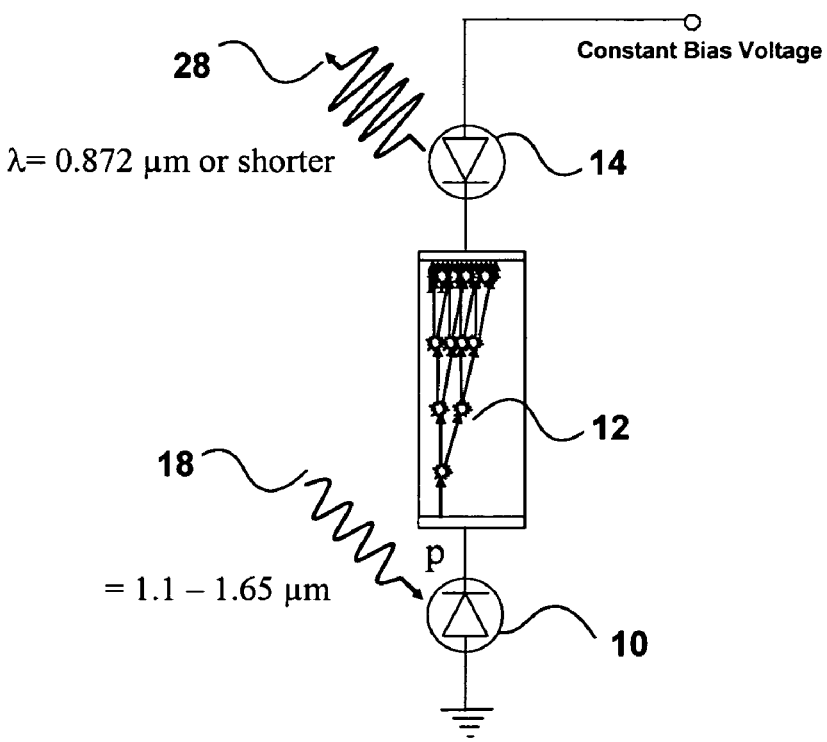
FIG. 2 is the equivalent circuit representation of the wavelength up-converting image intensifier device.

FIG. 2 shows the circuit representation of the integrated device. By properly designing the device structures (doping profiles, material compositions, thickness of layers) and selecting bias voltage, all three components, the PD 10, the avalanche multiplier 12 and the LED 14, turn on into their operating conditions. The PD 10 is held under reverse bias to efficiently collecting the photocurrent. A large voltage drop occurs across the layers of the avalanche multiplier. This yields a large electric field that is critical for the avalanche multiplication.

The LED 14 is forward biased close to and beyond the flat band condition. Additional current (generated from the photon absorption in the PD) will give rise to turning on or increasing IR or visible light emission from the LED 14. The incoming IR light at 1.1 to 1.65 µm is thus converted into outgoing IR light at 0.87 µm or visible light.

Figure 3:
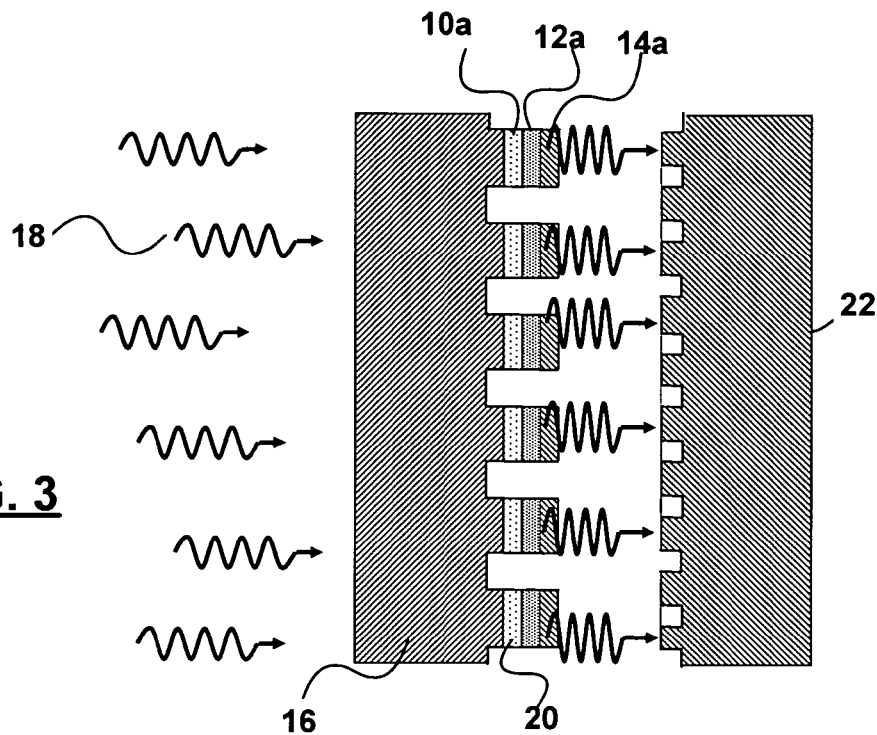
FIG. 3 is a representative cross-section (not to scale) of an array of wavelength up converting image intensifier elements juxtaposed an array of CCD elements.

FIG. 3 is a cross-section of a multi-pixel device wherein individual stacks 20 each comprising a photodetector, avalanche multiplier, and LED are integrated onto a common substrate 16 and subdivided into an array of working units. Each working unit forms a mesa structure and consists of a sub-photodetector 10a, a sub-avalanche multiplier 12a and a sub-LED 14a. All working units are connected in parallel and biased at a constant voltage.

A Si CCD 22 formed in a plane is placed with its detecting surface in close proximity to, and opposite, the sub-LEDs array. In operation, the incoming lit energy 18 passes through the substrate 16 and is detected by each sub-photodetector 10a. The resulting signal photocurrents are amplified by the sub-avalanche multipliers 12a and drive the corresponding sub-tEDs 14a to emit IR light at 0.87 µm or visible light. The outgoing energy is detected by the CCD 22 and is processed for display in a well know maimer. Due to the close proximity of the CCD to the PD-avalanche multiplier-LED array wafer, the wafer also acts as an optical filter, blocking visible light energy from reaching the CCD.

A large variety of commercial Si two-dimensional CCD arrays are available, for example, those made by Dalsa Inc. 605 McMurray Road, Waterloo, Ontario, N2V 2E9, Canada.

A pixelless imaging operation of wavelength up-converting image intensifier device can be achieved in similar ways to that described in U.S. Pat. No. 6,028,323. This patent further describes a few methods to minimize and/or eliminate unwanted distortion, smearing and shadowing of the up-converted image. These include thinning the substrate to a thickness of less than or equal to 50 µm and inserting a highly reflective or highly absorptive layer between the substrate and the active layers.

Figure 4A:
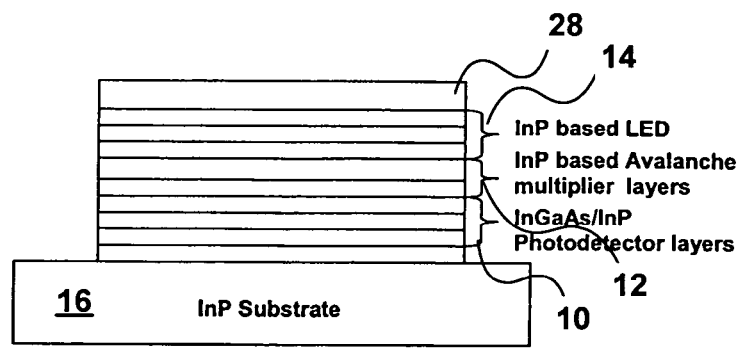
FIG. 4a is a side view (not to scale) of a wavelength up-converting image intensifier panel mesa structure on an InP substrate.

FIG. 4a shows in more detail the structure of an example prototype of an integrated device of a photodetector, an avalanche multiplier and an LED. The layers are, from bottom upward, a bottom contact layer of 700 nm n$^+$-InP doped at $1 \times 10^{18}$ cm$^{-3}$, 1000 nm intrinsic In$_{0.53}$Ga$_{0.47}$As layer, an intrinsic (or slightly p-doped) InP layer with a thickness of 2000 nm, 300 nm p$^+$-InP doped at $5 \times 10^{18}$ cm$^{-3}$, 60 nm InAs$_{0.1}$P$_{0.9}$ (intrinsic or slight p doped) for the LED active region, and finally the top contact layer of 500 nm n-InP (doping concentration of $1 \times 10^{18}$ cm$^{-3}$). All of the layers are epitaxially grown on a single substrate. In this case, the peak wavelength of the emission spectra is 1 µm, which is capable of being detected efficiently by a Si CCD camera.

Figure 4B:
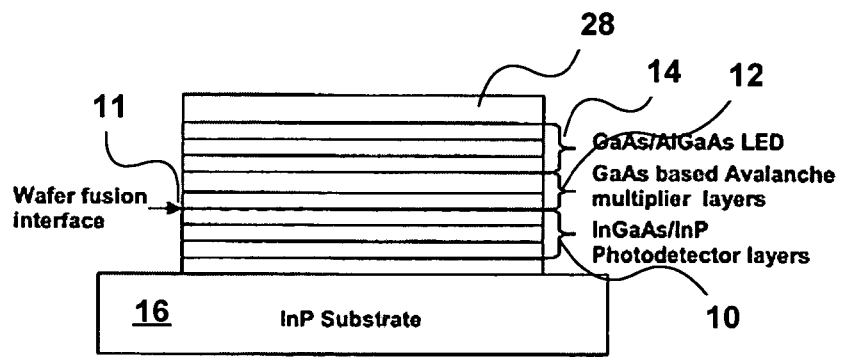
FIG. 4b is a side view (not to scale) of a wavelength up-converting image intensifier panel mesa structure on an InP substrate.

In other embodiments of the invention, the functioning layers of the photodetector, the avalanche multiplier and the LED are epitaxially grown on different wafers and integrated on one substrate via wafer fusion. The three component devices can be optimized independently and thus offer the best overall performance of the integrated devices. The impact of wafer fusion procedures on device performance can be minimized by optimizing the processing conditions. As an example, FIG. 4b shows in more detail the structure of a prototype device of a photodetector, an avalanche multiplier and an LED integrated via wafer fusion at an interface 11. The InGaAs/InP photodetector layers are epitaxially grown on an InP substrate. The GaAs/Al GaAs LED layers and the GaAs based avalanche multiplier layers are first grown on a GaAs substrate and then bonded to the InP wafer via the wafer fusion technology. The GaAs substrate is fully removed after the epi-layers transfer. The layers are, from bottom upward, a bottom contact layer of 700 nm n$^+$-InP doped at $1 \times 10^{18}$ cm$^{-3}$, 1000 nm intrinsic In$_{0.53}$Ga$_{0.47}$As layer, an intrinsic (or slightly p-doped) GaAs layer with a thickness of 2000 nm, 300 nm p$^+$-Al$_{0.3}$Ga$_{0.7}$As doped at $5 \times 10^{18}$ cm$^{-3}$, 100 nm GaAs (intrinsic or slight p-doped) for the LED active region, 300 nm carrier-confining layer of n-Al$_{0.3}$Ga$_{0.7}$As doped at $1 \times 10^{18}$ cm$^{-3}$, and finally the top cap layer 28 of 10 nm n-doped GaAs (doping concentration of $1 \times 10^{18}$ cm$^{-3}$).

The n$^+$-InP and i-In$_{0.53}$Ga$_{0.47}$As layers are grown on an InP substrate by metal organic chemical vapor deposition (MOCVD). The other layers are first grown on a GaAs substrate by molecular beam epitaxy (MBE) and then transferred to the InP substrate via wafer fusion. The thickness of the photodetector absorption layer of In$_{0.53}$Ga$_{0.47}$As can be increased to 2000 nm. This gives rise to ~90% of the incoming light at 1.5 µm being absorbed. The thickness and doping concentration of the GaAs avalanche multiplier layer can also be optimized to achieve large breakdown voltage and multiplication gain. GaAs-based LED technology is mature. Variations of the preferred embodiment can be easily designed for a wider IR or visible light range, i.e., as described in U.S. Pat. No. 6,028,323. At present, GaAs and InP wafers with a diameter of three inches or larger are commercially available. The state-of-the-art GaAs- or InP-based epitaxial materials have very low defect density. One can in principle make large-area panels of wavelength up-converting image intensifier, only limited by the wafer size and the defect density.

Figure 5A:
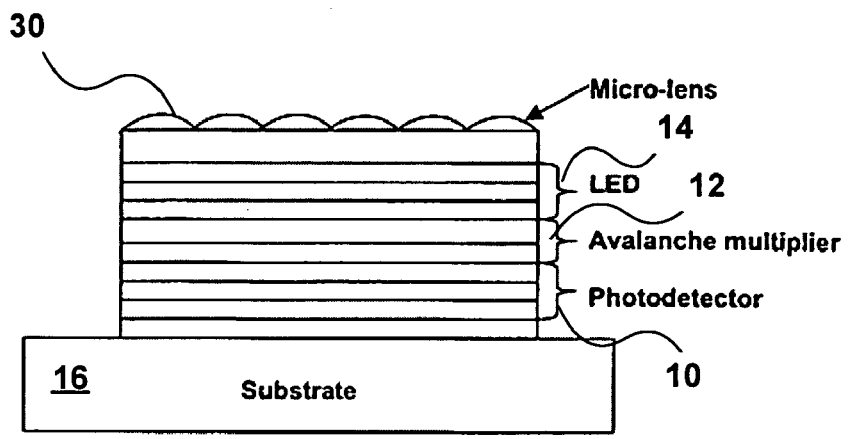
FIG. 5a illustrates a schematic device (not to scale) mesa structure in which micro-lens patterns are fabricated on the emission top surface.

FIG. 5a shows a schematic device mesa structure in which micro-lens patterns 30 are fabricated on the device top surface 28 to enhance the external extraction efficiency of the LED emission and therefore the overall device performance. The particular topographic shape of the micro-lens helps extract LED emission out of the semiconductor layers. This enhances the external efficiency of the LED and therefore the overall device performance.

Figure 5B:
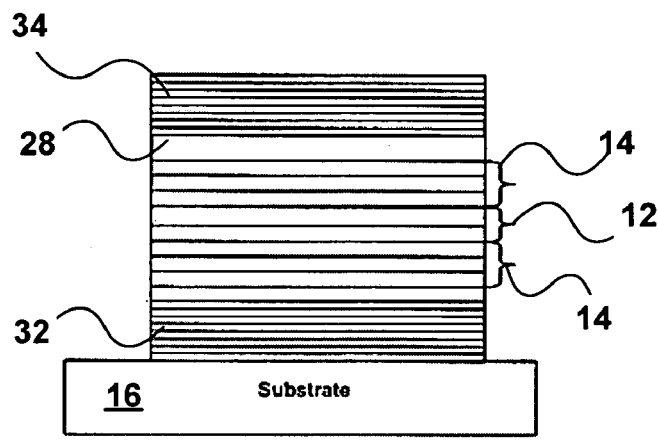
FIG. 5b illustrates a schematic device (not to scale) mesa structure in which distributed Bragg reflection (DBR) mirrors are fabricated on either side of the integrated device.

FIG. 5b illustrates another approach for enhancing the LED external efficiency. Two distributed Bragg reflection (DBR) mirrors 32, 34 are grown or integrated on the top and bottom of the device active layers. The two DBR mirrors 32, 34 and the device active region form a microcavity, which redirects LED spontaneous emission toward the device top surface. Constructive interference can bring much more light out, enhancing the brightness and efficiency of the device.

More details about the underlying physics and basic design of a microcavity can be found in Benisty et al.'s papers, IEEE Journal of Quantum Electronics, Vol. 34, pp. 1612–1631, and pp. 1632–1643, 1998, the contents of which are herein incorporated by reference.

Figure 6A:
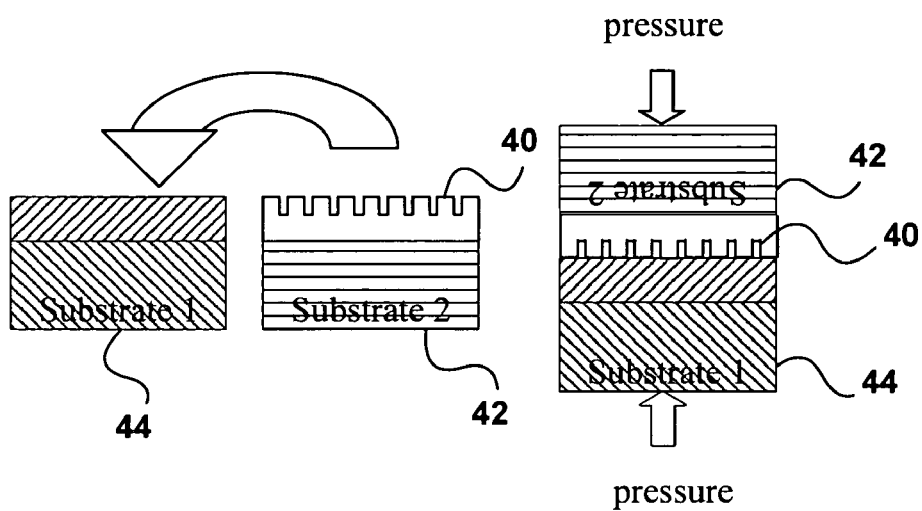
FIG. 6a illustrates the Van der Waals bonding step during wafer fusion procedures.

In the wafer fusion process, grooves 40 are etched into the surface of one 42 of the two mating wafers 42, 44. The grooves are typically 2–10 µm wide by 0.2 µm deep, with a period of 200–400 µm. In an exemplary embodiment, the two wafers are cleaned using a combination of solvents, dipped in dilute acid (i.e., HCl) solution, dried and placed together under pressure to Van der Waals (VdW) bond (see FIG. 6a). FIG. 6a illustrates the Van der Waals bonding step during wafer fusion procedures.

Figure 6B:
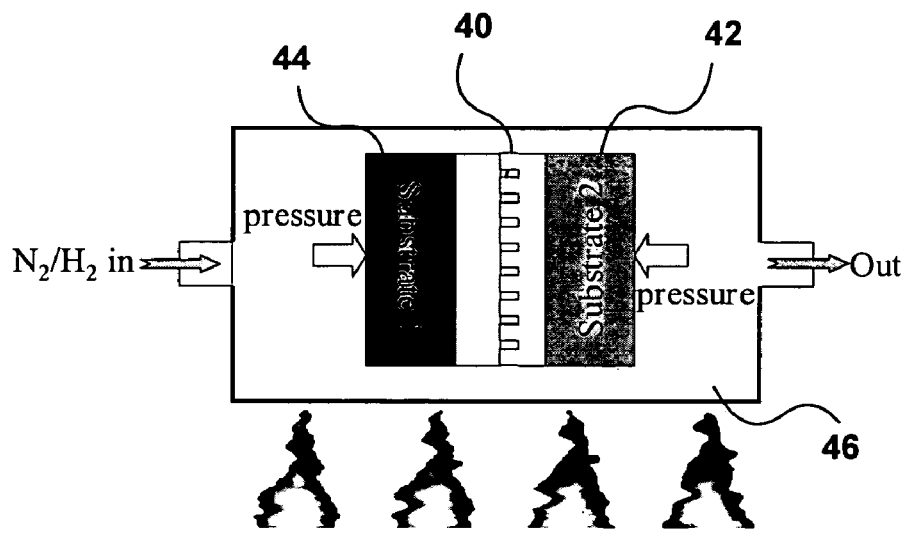
FIG. 6b illustrates the annealing step during wafer fusion procedures.

After the two wafers 42, 44 have been strongly VdW bonded together, they are heated to 500–600° C. for 30 minutes in a quartz tube 46 with a mixture of flowing $N_2/4$–7% $H_2$ at a pressure of about 1 MPa (FIG. 6b). FIG. 6b illustrates the annealing step during wafer fusion procedures. After annealing, the two wafers are permanently bonded together. The full substrate of one of the wafers is then mechanically and/or chemically removed to complete the transfer of the epi-layers.

One of the advantages of wafer fusion technology is that it permits the best performance of each functioning unit in the integrated device to be exploited by optimizing the epitaxial layers independently. For example, one of the best material systems for p-i-n photodetectors at 1.5 µm is $In_{0.53}Ga_{0.47}As/InP$, while GaAs/AlGaAs is very good for IR LED applications. Due to the lattice mismatch, these two systems are not suited to be grown epitaxially on the same substrate. However, they can be integrated together via the wafer fusion technology.

Figure 7:
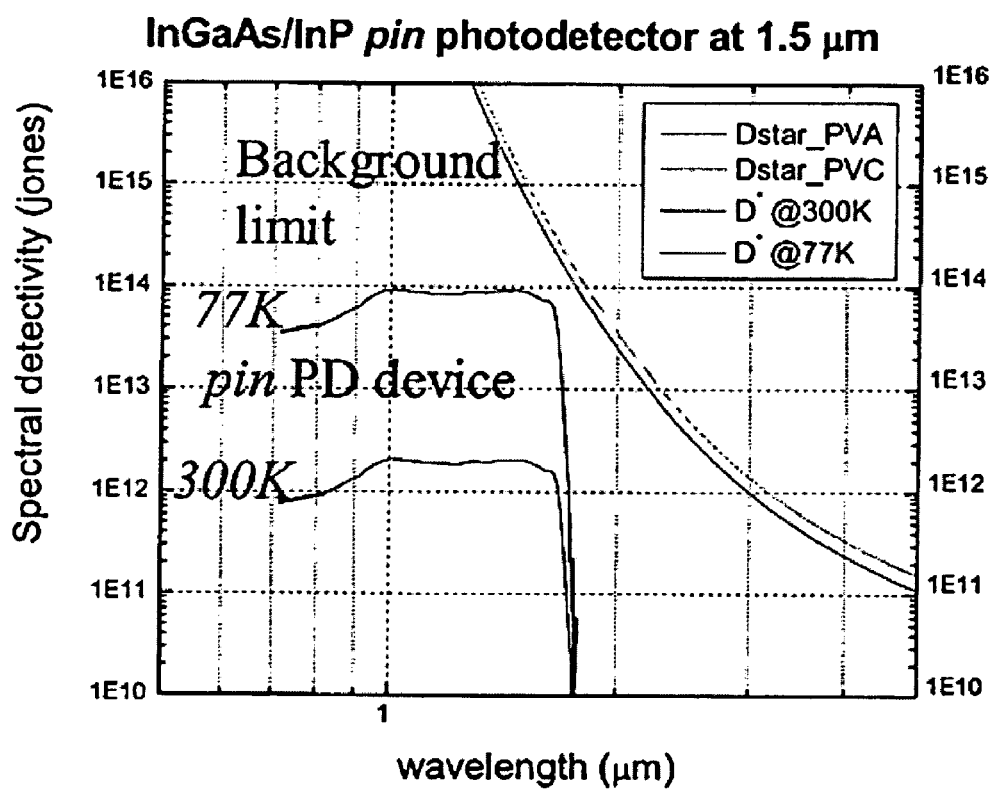
FIG. 7 is a graph of spectral detectivity of an individually fabricated $In_{0.53}Ga_{0.47}As/InP$ p-i-n photodetector operating at 77K and 300 K, respectively.

FIG. 7 shows the spectral detectivity of an $In_{0.53}Ga_{0.47}As/InP$ p-i-n photodetector. The spectral response covers a wavelength range from 1.1 to 1.65 µm. By cooling the device down to 77K, its spectral detectivity can be made very close to background limit.

Figure 8:
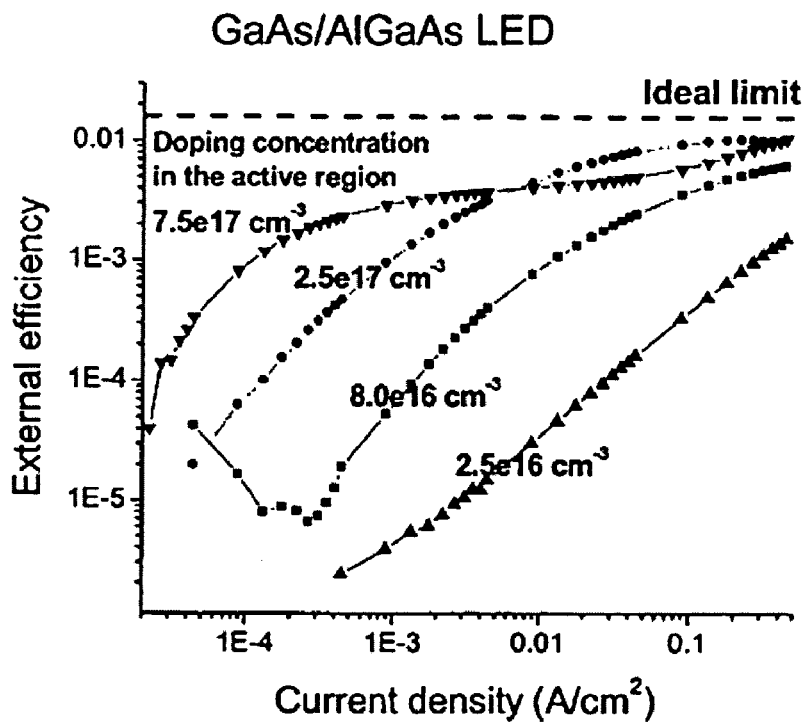
FIG. 8 is a graph of measured external efficiency of individually fabricated GaAs/Al GaAs LEDs (four devices, with different doping concentration of the active region) operating at room temperature.

FIG. 8 shows the external efficiency of four fabricated GaAs/Al GaAs LED devices. By optimizing doping concentration of the active region, the LED external efficiency is improved approximately to the ideal limit.

Figure 9A:
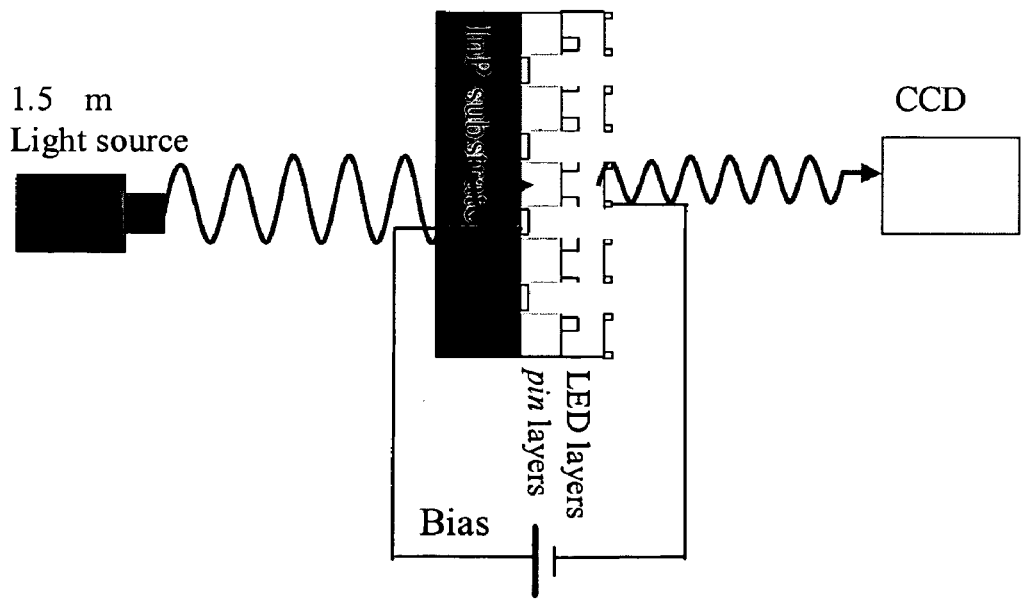
FIG. 9a is a schematic experimental setup for wavelength up-conversion imaging.

FIG. 9a shows the schematic setup for demonstrating wavelength up-converting operation of a device fabricated by wafer fusing an $In_{0.53}Ga_{0.47}As/InP$ p-i-n photodetector with a GaAs/Al GaAs LED.

Figure 9B:
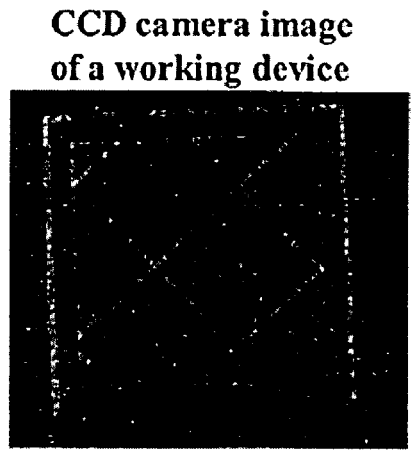
FIG. 9b is a captured CCD image from a working wavelength up-converter device (room-temperature), the device size being 800 μm×800 μm.

FIG. 9b shows an image of the IR emission from the top surface of an operating device captured by a CCD camera. The device converts the incident IR light with peak wavelength at 1.47 µm (emitted from a diode laser) to outgoing IR light with peak wavelength at 0.87 µm. The grooves buried underneath device surface are clearly observed.

Figure 10A:
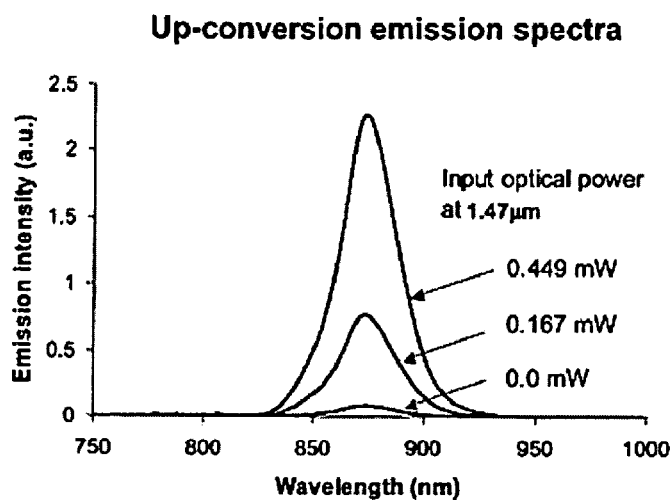
FIG. 10a shows the room temperature emission spectra of a wavelength up-converter device (The input signal is peaked at 1.47 μm in wavelength)
Figure 10B:
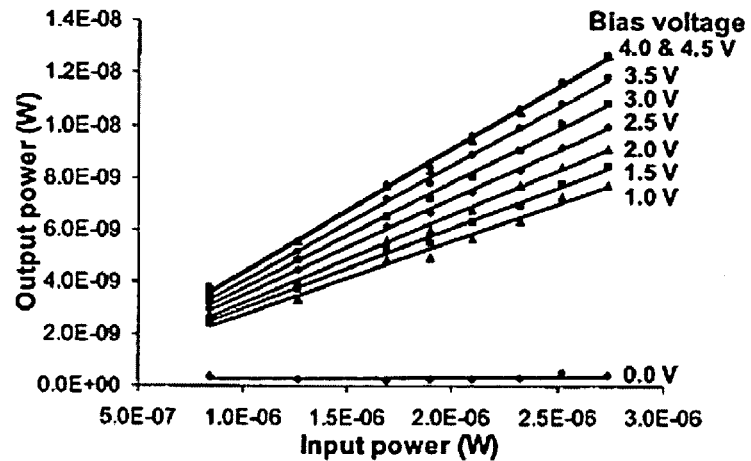
FIG. 10b is a graph of the output optical power at 0.87 μm vs. the input optical power at 1.47 μm under different bias voltages at room temperature.

FIGS. 10a and 10b illustrate other experimental results of a successful laboratory prototype. FIG. 10a shows the up-conversion emission spectra of the device, peaked at 872 nm. With the device being biased at a constant voltage, the emission intensity increases roughly linearly with the input optical power at 1.47 µm.

FIG. 10b shows the output optical power at 0.87 µm vs. the input optical power at 1.47 µm under different bias voltages at room temperature. External up-conversion power efficiency of $4.7 \times 10^{-3}$ W/W is obtained at a bias of 4.0 V, corresponding to an internal up-conversion quantum efficiency of 18%. No upconversion is observed at zero bias. For bias voltage at and above 1.0 V, the output power increases linearly with the input power. The higher the applied bias, the larger the slope of the curves becomes. The external up-conversion power efficiency is estimated from the curve slope to be $4.7 \times 10^{-3}$ W/W at a bias of 4.0 V.

It should be noted that this prototype device consists only of a photodetector and an LED. With the incorporation of an avalanche multiplier and other measures for enhancing the LED external efficiency, the up-conversion power efficiency is expected to increase by a factor of 10–100. However, even with the current low up-conversion efficiency, the up-converted IR light from a longer wavelength emission could be easily detected by a Si CCD camera. This explains the significance of the wavelength up-conversion in detecting an IR emission with wavelength longer than 1.1 µm using a Si CCD camera.

The above described wavelength up-converters can easily be scaled up into efficient and inexpensive pixelless panel device or pixelized devices with two-dimensional arrays for wavelength up-conversion and/or image intensification applications.

It will be apparent to those skilled in the art that many further embodiments of the invention are possible within the scope of the appended claims.

We claim:

1. A wavelength conversion device comprising:
   a photodetector for generating a photocurrent in response to the detection of radiation at a first wavelength;
   an avalanche multiplier for amplifying said photo current; and
   a light emitting element driven by said amplified photocurrent to produce radiation at a second wavelength different from said first wavelength and corresponding to detected radiation at said first wavelength;
   wherein said photodetector, said avalanche multiplier, said light emitting element are arranged in a stacked innervated structure selected from the group consisting of: a structure wherein said photodetector, said avalanche multiplier, and said light emitting element are located on different wafers which are fusion bonded together, and a structure wherein functional layers of said photodetector, said avalanche multiplier, and said light emitting element are epitaxial layers grown on a common substrate.

2. A wavelength conversion device as claimed in claim 1, wherein said second wavelength is shorter than said first wavelength.

3. A wavelength conversion device as claimed in claim 2, wherein said photodetector is integrated onto a transparent substrate through which said radiation at a first wavelength passes to impinge on said photodetector.

4. A wavelength conversion device as claimed in claim 3, wherein said integrated stacked arrangement comprises III–V semiconductors.

5. A wavelength conversion device as claimed in claim 4, wherein said light emitting element is a light emitting diode.

6. A wavelength conversion device as claimed in claim 5, wherein said photodetector comprises $In_xGa_{1-x}As/InP$ layers.

7. A wavelength conversion device as claimed in claim 6, wherein said avalanche multiplier and said LED comprise InP and InPAs layers, respectively.

8. A wavelength conversion device as claimed in claim 7, wherein said layers are epitaxial layers.

9. A wavelength conversion device as claimed in claim 6, wherein said avalanche multiplier and said light emitting diode comprise GaAs and GaAs/AlGaAs layers respectively.

10. A wavelength conversion device as claimed in claim 3, wherein said first wavelength lies in the infrared range and said second wavelength lies in the near infrared or visible range.

11. A wavelength conversion device as claimed in claim 10, wherein said first wavelength lies in the range of 1.1 to 1.65 microns.

12. A wavelength conversion device as claimed in claim 1 wherein said photodetector and light emitting element are provided with optical windows to permit pixelless up conversion of an image.

13. A wavelength conversion device as claimed in claim 1, comprising an array of said stacked arrangements arranged in parallel to permit pixellized up conversion of an image.

14. A wavelength conversion device as claimed in claim 13, wherein said stacked arrangements are located on a common transparent substrate.

15. A thermal imaging device comprising:
 a) at least one integrated stack including:
  (i) a photodetector for generating a photocurrent in response to the detection of far infrared radiation;
  (ii) an avalanche multiplier for amplifying said photocurrent; and
  (iii) a light emitting diode driven by said amplified photocurrent to produce near infrared or visible radiation corresponding to said detected far infrared; and
  (iv) wherein said photodetector, said avalanche multiplier, and said light emitting element are arranged in a stacked integrated structure selected from the group consisting of: a structure wherein photodetector, said avalanche multiplier, and said light emitting diode are gown on different wafers which are fusion bonded together, and a structure wherein said functional layers of said photodetector, said avalanche multiplier, and said light emitting diode are epitaxial layers grown an a common substrate; and
 b) a camera for generating an image from said near infrared or visible radiation.

16. A thermal imaging device as claimed in claim 15, comprising an array of said integrated stacks on a common transparent substrate to provide a pixellated output.

17. A thermal imaging device as claimed in claim 16, wherein said camera is a charge coupled device having individual elements opposing said respective integrated stacks.

18. A thermal imaging device as claimed in claim 16, further comprising a micro-lens fabricated on the surface of said light emitting element.

19. A thermal imaging device as claimed in claim 15, comprising window openings to permit the formation of a pixelless image, and said camera is a charge-coupled device.

20. A thermal imaging device as claimed in claim 15, wherein said integrated stack comprises a III–V material system.

* * * * *